United States Patent
Zhang et al.

(10) Patent No.: US 6,974,501 B1
(45) Date of Patent: Dec. 13, 2005

(54) MULTI-LAYER ARTICLES AND METHODS OF MAKING SAME

(75) Inventors: Wei Zhang, Shrewsbury, MA (US); Martin W. Rupich, Framingham, MA (US); Suresh Annavarapu, Brookline, MA (US); Leslie G. Fritzemeier, Mendon, MA (US); Edward J. Siegal, Malden, MA (US); Valery Prunier, Bucey-en-Othe (FR); Qi Li, Marlborough, MA (US)

(73) Assignee: American Superconductor Corporation, Westborough, MA (US)

( * ) Notice: Subject to any disclaimer, the term of this patent is extended or adjusted under 35 U.S.C. 154(b) by 679 days.

(21) Appl. No.: 09/615,999

(22) Filed: Jul. 14, 2000

Related U.S. Application Data

(60) Provisional application No. 60/166,297, filed on Nov. 18, 1999, provisional application No. 60/166,145, filed on Nov. 18, 1999, and provisional application No. 60/166,140, filed on Nov. 18, 1999.

(51) Int. Cl.$^7$ .......................... B05D 5/12; C30B 28/14; H01L 39/24
(52) U.S. Cl. ..................... 117/84; 117/88; 117/94; 117/97; 117/106; 505/470; 505/473; 505/728; 505/729; 427/62; 427/314; 427/402; 29/599
(58) Field of Search .................. 427/62, 307, 314; 505/100, 470, 473, 728, 729; 29/599; 117/84, 88, 94, 97, 106

(56) References Cited

U.S. PATENT DOCUMENTS

| | | |
|---|---|---|
| 3,763,552 A | 10/1973 | Brown et al. |
| 3,985,281 A | 10/1976 | Diepers et al. |
| 4,442,396 A | 4/1984 | Hucker |
| 4,659,973 A | 4/1987 | Stich |
| 4,859,652 A | 8/1989 | Block |
| 4,882,312 A | 11/1989 | Mogro-Campero et al. |
| 4,956,340 A | 9/1990 | Kimura et al. |

(Continued)

FOREIGN PATENT DOCUMENTS

| | | |
|---|---|---|
| EP | 0308869 | 9/1988 |
| EP | 0 387 525 | 9/1990 |
| EP | 0 431 782 | 6/1991 |
| EP | 0506582 A2 | 9/1992 |
| EP | 0 584 410 | 3/1994 |
| EP | 0 872 579 | 10/1998 |
| JP | 57075564 | 5/1982 |
| JP | 63310366 | 12/1988 |
| WO | WO 91 16149 | 10/1991 |
| WO | WO92/05591 | 4/1992 |
| WO | WO 98/58415 | 12/1993 |
| WO | WO 97/05669 | 2/1997 |
| WO | WO 99/16941 | 4/1999 |
| WO | WO 99/17307 | 4/1999 |
| WO | WO 99/25908 | 5/1999 |
| WO | WO 99/35083 | 7/1999 |
| WO | WO 01/98076 | 12/2001 |

OTHER PUBLICATIONS

Koster et al., Influence of the surface treatment on the homoepitaxial growth of SrTiO3 Material Science & Emgineering, vol. B56 pp. 209–212 1998.*

(Continued)

*Primary Examiner*—Brian K. Talbot
(74) *Attorney, Agent, or Firm*—Fish & Richardson P.C.

(57) ABSTRACT

The invention relates to multi-layer articles and methods of making such articles. The methods include first conditioning the surface of an underlying layer, such as a buffer layer or a superconductor layer, then disposing a layer of material on the conditioned surface. The conditioned surface can be a high quality surface. Superconductor articles formed by these methods can exhibit relatively high critical current densities.

50 Claims, 4 Drawing Sheets

U.S. PATENT DOCUMENTS

| | | | |
|---|---|---|---|
| 4,959,347 A | | 9/1990 | Kobayashi et al. |
| 4,994,433 A | | 2/1991 | Chiang |
| 4,994,435 A | | 2/1991 | Shiga et al. |
| 5,038,127 A | | 8/1991 | Dersch |
| 5,071,828 A | | 12/1991 | Greuter et al. |
| 5,073,537 A | | 12/1991 | Hung et al. |
| 5,229,358 A | | 7/1993 | Kumar |
| 5,231,074 A | | 7/1993 | Cima et al. |
| 5,234,901 A | * | 8/1993 | Saitoh et al. ............... 505/1 |
| 5,236,890 A | | 8/1993 | Murakami et al. |
| 5,304,533 A | | 4/1994 | Kobayashi et al. |
| 5,427,055 A | | 6/1995 | Ichikawa |
| 5,449,659 A | | 9/1995 | Garrison et al. |
| 5,484,766 A | | 1/1996 | Shah et al. |
| 5,534,491 A | * | 7/1996 | Nakamura et al. .......... 505/500 |
| 5,571,603 A | | 11/1996 | Utumi et al. |
| 5,728,214 A | * | 3/1998 | Konishi et al. ............... 117/94 |
| 5,741,377 A | | 4/1998 | Goyal et al. |
| 5,866,252 A | | 2/1999 | de Rochemont et al. |
| 5,958,599 A | | 9/1999 | Goyal et al. |
| 5,964,966 A | | 10/1999 | Goyal et al. |
| 5,968,877 A | | 10/1999 | Budai et al. |
| 5,981,445 A | | 11/1999 | Kirchnerova et al. |
| 6,022,832 A | | 2/2000 | Fritzemeier et al. |
| 6,027,564 A | | 2/2000 | Fritzemeier et al. |
| 6,077,344 A | | 6/2000 | Shoup et al. |
| 6,172,009 B1 | | 1/2001 | Smith et al. |
| 6,256,521 B1 | | 7/2001 | Lee et al. |

OTHER PUBLICATIONS

Tanaka et al., Improvement of YBa2Cu3Ox Single–Crystal Surface by Chemical Etching, Japan Journal Applied Physics, vol. 3 pp. L731–L733, 1999.*

Smith, J.A. et al., "High Critical Current Density Thick MOD–Derived YBCO Films,"Transactions on Applied Superconductivity, vol. 9, No. 2, Jun. 1999.

G. Moore et al., "Sol–Gel Processing of $Y_1Ba_2Cu_3O_{7x}$ Using Alkoxide Precursors: Two Systems Yielding High Degrees of Thin Film Orientation and Crystal Growth", *Materials Letters*, vol. 7, No. 12, Mar. 1989, pp. 415–424.

M.W. Rupich et al., "Synthesis of Superconductors from Soluble Metal Oxo Alkoxide Precursors", *J. Mater. Res.*, vol. 8, No. 7, Jul. 1993, pp. 1487–1496.

Apicella, M.L. et al., "The Effects of Surface Contamination on the Biaxially Textured Substrate for YBCO Thick Film Deposition", *International Journal of Modern Physics B*, vol. 13, Nos. 9&10 (1999) 997–1004.

Boffa V. et al., "Laser–ablation deposition of $CeO_2$ thin films on biaxially textured nickel substrates" *Physica C*. vol. 312, (1999), pp. 202–212.

IBM Technical Disclosure Bulletin, "Fabrication of High Temperature Superconducting Films Using Perfluoro–Organometallic Precursors", vol. 32, No. 5B, Oct. 1989, p. 241.

McIntyre, Paul C. et al., "Effect of growth conditions on the properties and morphology of chemically derived epitaxial thin films of $Ba_2Ycu_3O_{7-x}$ on (001) $LaAIO_3$", *J. Appl. Phys.*, vol. 71, No. 4, Feb. 15, 1992, pp. 1868–1877.

Qing He, D.K. et al., "Deposition of biaxially–oriented metal and oxide buffer–layer films on textured Ni tapes: new substrates for high–current high–temperature superconductors", *Physica C*, vol. 275 (1997) pp. 155–161.

Sheth, Atul et al., "Bench Scale Evaluation of Batch Mode Dip–Coating of Sol–Gel La $AIO_3$ Buffer Material", *IEEE Transactions on Applied Superconductivity*, vol. 9, No. 2, Jun. 1999, pp. 1514–1518.

Boffa V. et al., Laser–ablation deposition of $CeO_2$ thin films on biaxially textured nickel substrates Physica. C 312, 1999, 202–212.

Gupta et al., "Superconducting oxide films with high transition temperature prepared from metal trifluoracetate precursors", 320 Applied Physics Letters 52 Jun. 13, 1988 No. 24 pp. 2077–2079.

McIntyre et al., "Epitazial nucleation and growth of chemically derived $Ba_2Ycu_3O_{7-x}$ thin films on (001) $SrTiO_3$", Journal Applied Physics 77 (May 15, 1995), No. 10.

Beach et al., "Sol–Gel Synthesis of Rare Earth Aluminate Films as Buffer Layers for High Te Superconducting Films," Mat. Res. Soc. Symp. Proc., vol. 495, 263 (1997).

Lee et al., "Alternative Buffer Architectures for High Critical Current Density YBCO Superconducting Deposits on Rolling Assisted Biaxially–Textured Substrates,"Japanese J. Appl. Phys., vol. 38, L178 (1999).

Paranthaman et al., "Growth of Biaxially Textured $RE_3 O_3$ Buffer Layers on Rolled–Ni Substrates Using Reactive Evaporation for HTS–Coated Conductors," Superconductor Sci. Tech., vol. 12, 319 (1999).

Rupich et al., "Growth and Characterization of Oxide Buffer Layers for YBCO Coated Conductors," IEEE Trans. on Appl. Superconductivity, vol. 9 (1999).

Shoup et al., "Epitaxial Thin Film Growth of Lanthanum and Neodymium Aluminate Films on Roll–Textured Nickel Using a Sol–Gel Method," J. Am. Cer. Soc., vol. 81, 3019 (1998).

"Silicon Processing for the VLSI Era," vol. 1, eds. S. Wolf and R.N. Tanber, Lattice Press, Sunset Park, CA, pp. 539–574 (1986).

He et al., "Growth of Biaxlly Oriented Conductive $LaNiO_3$, Buffer Layers on Textured Ni Tapes for High–$T_{cf}$–Coated Conductors," *Physica C 314* (1999) pp. 105–111.

Koster et al., "Fl Influene of the Surface Treatment on the Homoepitaxial Growth of $SrTiO_3$," *Materials Science & Engineering B56* (1998) pp. 209–212.

Tanaka et al., "Improvement of $Yba_2Cu_3O_x$ Single–Crystal Surface by Chemical Etching," *Jpn. J. Appl. Phys. vol. 38* (1999) pp. 1731–1733.

International Search Report.

* cited by examiner

MULTI-LAYER ARTICLES AND METHODS OF MAKING SAME

CROSS-REFERENCE TO RELATED APPLICATIONS

The present application claims priority under 35 U.S.C. §119(e)(1) to commonly owned U.S. Provisional Patent Application Ser. No. 60/166,140, filed Nov. 18, 1999, and entitled "Multi-Layer Articles and Methods of Making Same," which is hereby incorporated by reference which claims benefit to 60/166,297, filed Nov. 18, 1999 and claims benefit of 60/166,145 filed Nov. 18, 1999.

BACKGROUND OF THE INVENTION

Multi-layer articles can be used in a variety of applications. For example, superconductors, including oxide superconductors, can be formed of multi-layer articles. Typically, such superconductors include a layer of superconductor material and a layer, commonly referred to as a substrate, that can enhance the mechanical strength of the multi-layer article.

Generally, in addition to enhancing the strength of the multi-layer superconductor, the substrate should exhibit certain other properties. For example, the substrate should have a low Curie temperature so that the substrate is not ferromagnetic at the superconductor's application temperature. Furthermore, chemical species within the substrate should not be able to diffuse into the layer of superconductor material, and the coefficient of thermal expansion of the substrate should be about the same as the superconductor material. Moreover, if the substrate is used for an oxide superconductor, the substrate material should be relatively resistant to oxidation.

For some materials, such as yttrium-barium-copper-oxide (YBCO), the ability of the material to provide high transport current in its superconducting state depends upon the crystallographic orientation of the material. For example, such a material can exhibit a relatively high critical current density (Jc) when the surface of the material is biaxially textured.

As used herein, "biaxially textured" refers to a surface for which the crystal grains are in close alignment with a direction in the plane of the surface. One type of biaxially textured surface is a cube textured surface, in which the crystal grains are also in close alignment with a direction perpendicular to the surface. Examples of cube textured surfaces include the (100)[001] and (100)[011] surfaces, and an example of a biaxially textured surface is the (113)[211] surface.

For certain multi-layer superconductors, the layer of superconductor material is an epitaxial layer. As used herein, "epitaxial layer" refers to a layer of material whose crystallographic orientation is directly related to the crystallographic orientation of the surface of a layer of material onto which the epitaxial layer is deposited. For example, for a multi-layer superconductor having an epitaxial layer of superconductor material deposited onto a substrate, the crystallographic orientation of the layer of superconductor material is directly related to the crystallographic orientation of the substrate. Thus, in addition to the above-discussed properties of a substrate, it can be also desirable for a substrate to have a biaxially textured surface or a cube textured surface.

Some substrates do not readily exhibit all the above-noted features, so one or more intermediate layers, commonly referred to as buffer layers, can be disposed between the substrate and the superconductor layer. The buffer layer(s) can be more resistant to oxidation than the substrate, and reduce the diffusion of chemical species between the substrate and the superconductor layer. Moreover, the buffer layer(s) can have a coefficient of thermal expansion that is well matched with the superconductor material.

Typically, a buffer layer is an epitaxial layer, so its crystallographic orientation is directly related to the crystallographic orientation of the surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer. Therefore, the superconducting properties exhibited by a multi-layer superconductor having a buffer layer can depend upon the crystallographic orientation of the buffer layer surface.

The surface of a buffer layer can include certain imperfections and/or impurities. These imperfections and/or impurities can affect the crystallographic orientation of an epitaxial layer deposited onto the surface of the buffer layer (e.g., an epitaxial layer of a superconductor material), which can decrease the ability of the resulting multi-layer superconductor to exhibit certain superconducting properties.

SUMMARY OF THE INVENTION

The invention relates to multi-layer articles (e.g., multi-layer superconductors) and methods of making such multi-layer articles. In general, the methods involve conditioning (e.g., by chemical conditioning and/or thermal conditioning) the surface of an underlying layer (e.g., a buffer layer or a superconductor material layer), and then depositing a layer of material (e.g., a superconductor material, a precursor of a superconductor material, a cap material or a buffer layer material), onto the conditioned surface of the underlying layer. The conditioned surface can be relatively smooth, have a relatively high density, have a relatively low density of impurities, exhibit enhanced adhesion to other material layers, and/or exhibit a relatively small rocking curve width as measured by x-ray diffraction. A multi-layer superconductor prepared by the methods of the invention can exhibit a relatively high critical current density ($J_c$). A multi-layer superconductor prepared by the methods of the invention can be formed into an object having a relatively large surface area, such as a wafer or a tape.

"Chemical conditioning" as used herein refers to a process which uses one or more chemical species (e.g., gas phase chemical species and/or solution phase chemical species) to affect changes in the surface of a material layer, such as a buffer layer or a superconductor material layer.

"Thermal conditioning" as used herein refers to a process which uses elevated temperature, with or without chemical conditioning, to affect changes in the surface of a material layer, such as a buffer layer or a superconductor material layer. Preferably, thermal conditioning occurs in a controlled environment (e.g., temperature and pressure).

In one aspect, the invention features a method of making a multi-layer article which includes chemically conditioning the surface of a buffer layer or a superconductor layer to form a conditioned surface, and disposing a layer of a second material on the conditioned surface.

In another aspect, the invention features a method of making a multi-layer article, which includes heating the surface of a buffer layer or a superconductor layer to a temperature at least about 5° C. above the deposition temperature or the crystallization temperature of the layer. The layer is heated at an oxygen gas pressure of less than about 700 Torr to form a conditioned surface. The method also includes disposing a second material layer on the conditioned surface.

"Deposition temperature" as used herein refers to the temperature at which the layer being conditioned was deposited.

"Crystallization temperature" as used herein refers to the temperature at which a layer of initially non-crystalline or amorphous material takes on a crystalline form.

In a further aspect, the invention features a method of making a multi-layer article which includes heating the surface of a buffer layer or a superconductor layer to a temperature at least about 5° C. above the crystallization or deposition temperature of the layer to form a conditioned surface. The buffer layer or superconductor layer is disposed on the surface of a polycrystalline material. The method further includes disposing a second material layer on the conditioned surface.

Examples of polycrystalline materials include materials formed by deformation texturing and materials formed by vacuum deposition (e.g., ion beam assisted deposition).

In certain embodiments, two or more of the foregoing methods can be combined.

The conditioned surface can be biaxially textured.

The second material can be a buffer material, a cap material, a superconductor material or a precursor of a superconductor material.

The multi-layer articles can include additional layers of material, such as, for example, superconductor material layers and/or buffer material layers. The surface of one or more of the additional layers can be conditioned as described herein and can exhibit the properties of a conditioned surface as described herein.

The multi-layer articles can have one or more layers of superconductor material with a critical current density of at least about $1 \times 10^6$ Amperes per square centimeter.

One potential advantage of the invention is that it can provide multi-layer superconductors having one or more layers of superconductor material with a relatively high critical current density, and methods of making such superconductors.

Another potential advantage of the invention is that it can provide a multi-layer article (e.g., a multi-layer superconductor), as well as methods of making such a multi-layer article, having a buffer layer and/or a superconductor layer with a high quality surface. For example, the surface can be relatively smooth, have a relatively high density, have a relatively low density of impurities, exhibit enhanced adhesion to other material layers, and/or have a relatively small rocking curve width as measured by x-ray diffraction.

An additional potential advantage of the invention is that it can provide methods of making multi-layer articles (e.g., multi-layer superconductors) which can be performed using a wide range of conditions (e.g., temperature, gas environment and gas pressure).

A further potential advantage of the invention is that it can provide methods of making a multi-layer article (e.g., a multi-layer superconductor) without using a high oxygen pressure during preparation of one or more underlying material layers, such as a buffer layer and/or a layer of superconductor material. This can allow relatively oxygen sensitive materials, such as silver or nickel, to be used as the underlying layer (e.g., the substrate).

Still a further potential advantage of the invention is that it can provide methods of making a multi-layer article (e.g., a multi-layer superconductor) while using chemical conditioning to condition the surface of one or more underlying material layers, such as during the preparation of a buffer layer and/or a layer of superconductor material. This can reduce the cost and complexity associated with preparing the multi-layer article.

Another potential advantage of the invention is that it can provide methods of making a multi-layer superconductor in which the superconductor material, or a precursor thereof, can be disposed on a conditioned surface of an underlying layer (e.g., a superconductor material layer or a buffer layer) without first annealing the conditioned surface. This can reduce the cost and complexity associated with preparing the underlying layer.

In embodiments in which multiple underlying layers (e.g. multiple buffer layers and/or multiple superconductor material layers) are used in the multi-layer article, the foregoing methods and/or advantages can apply to one or more of the multiple underlying layers.

In some embodiments, the superconductor material is preferably formed of YBCO (e.g., $YBa_2Cu_3O_{7-x}$).

Unless otherwise defined, all technical and scientific terms used herein have the same meaning as commonly understood by one of ordinary skill in the art to which this invention belongs. Although methods and materials similar or equivalent to those described herein can be used in the practice of the invention, suitable methods and materials are described below. In case of conflict, the present specification, including definitions, will control. In addition, the materials, methods, and examples are illustrative only and not intended to be limiting.

Other features, aspects and advantages of the invention will be apparent from the figures, the description of the preferred embodiments thereof and the claims.

DESCRIPTION OF THE PREFERRED EMBODIMENTS

The invention relates to multi-layer articles, such as superconductor articles, and methods of making such multi-layer articles. The methods involve conditioning the surface of a buffer layer and/or a superconductor layer, then disposing another material layer (e.g., a superconductor material, a precursor of a superconductor material, a cap material or a buffer material) onto he conditioned surface.

A surface conditioned according to the methods of the invention can have a well defined crystallographic orientation. Preferably, the surface is a biaxially textured surface (e.g., a (113)[211] surface), such as a cube textured surface (e.g., a (100)[011] surface or a (100)[001] surface). Preferably, the peaks in an X-ray diffraction pole figure of such a conditioned surface have a full width at half maximum (FWHM) of less than about 20° (e.g., less than about 15°, less than about 10°, or from about 5° to about 10°).

A surface conditioned according to the methods of the invention can be relatively smooth. For example, subsequent to chemical conditioning and/or thermal conditioning, the surface can be smoother than prior to conditioning as determined by high resolution scanning electron microscopy or atomic force microscopy.

A surface conditioned by the methods of the invention can have a relatively small rocking curve width as measured by x-ray diffraction. For example, after chemical conditioning and/or thermal conditioning, the surface can include domains that are aligned orthogonal to each other and/or domains that have straight edges.

A surface conditioned by the methods of the invention can have a relatively high density. For example, subsequent to chemical conditioning and/or thermal conditioning, the surface can have fewer surface voids or cracks as determined by viewing the surface at relatively high magnifications (e.g., at least about 30,000 times magnification).

A surface conditioned by the methods of the invention can have a relatively low density of impurities. For example, subsequent to chemical conditioning and/or thermal conditioning, the surface can have a relatively small amount of foreign compounds as determined by viewing the surface at relatively high magnifications (e.g., at least about 30,000 times magnification).

A surface conditioned by the methods of the invention can exhibit good adhesion to other materials. For example, after chemical conditioning and/or thermal conditioning, the surface can demonstrate reduced spalling as determined by optical inspection, scanning electron microscopy and/or atomic force microscopy.

Figure 1:
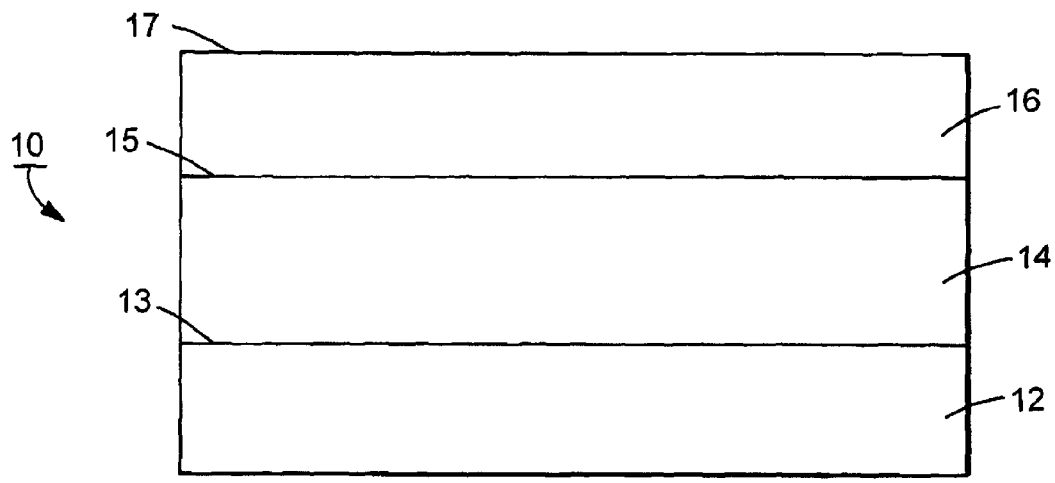
FIG. 1 is a cross-sectional view of one embodiment of a multi-layer article.

FIG. 1 shows an embodiment of a multi-layer article 10 (e.g., a wafer or a tape) that can be formed by the methods of the invention. Article 10 includes material layers 12, 14 and 16. During the preparation of article 10, layer 14 is disposed (e.g., epitaxially disposed) on surface 13 of layer 12. Surface 15 of layer 14 is then conditioned according to a method of the invention, and layer 16 is then disposed on conditioned surface 15.

In some embodiments, the method of conditioning surface 15 involves thermal conditioning. In general, surface 15 can be thermally conditioned using a variety of conditions. For example, surface 15 can be thermally conditioned at atmospheric pressure, below atmospheric pressure or above atmospheric pressure. In addition, the atmosphere to which surface 15 is exposed during thermal conditioning can be a chemically conditioning environment (e.g., an oxidizing environment, a reducing environment) or an inert environment.

In certain embodiments, a relatively high total gas pressure is used when thermally conditioning surface 15. For example, a total gas pressure of at least about 1 Torr can be used when conditioning surface 15. In these embodiments, the total gas pressure is preferably at least about 10 Torr, more preferably at least about 100 Torr, and most preferably at least about 760 Torr. In certain embodiments, using a relatively high oxygen gas pressure to thermally condition surface 15 can result in surface 15 having good adhesion.

In other embodiments, a relatively low total gas pressure can be used when conditioning surface 15. For example, a total gas pressure of less than about 1 Torr can be used (e.g., less than about $1\times10^{-1}$ Torr, such as less than about $1\times10^{-3}$ Torr).

In some embodiments, such as when layer 12 is formed of an oxygen sensitive material, a low oxygen gas pressure can be used when conditioning surface 15. For example, an oxygen gas pressure of less than about 700 Torr (e.g., less than about 100 Torr) can be used. Preferably, in these embodiments, the oxygen gas pressure is less than about 1 Torr, more preferably less than about 0.1 Torr, and most preferably less than about $1\times10^{-5}$ Torr.

Examples of gases that can be used when thermally conditioning surface 15 at low oxygen gas pressure include inert gases (e.g., helium, neon, krypton and/or argon gases), hydrogen gas, or forming gas (e.g., a mixture of argon gas and hydrogen gas containing, for example, about 4 volume percent hydrogen gas or about 5 volume percent hydrogen gas), air, oxygen, nitrogen, carbon monoxide, carbon dioxide, nitrogen oxides and mixtures of these gases. In certain embodiments, the gas mixture can also include water vapor. For example, the gas can be forming gas that contains water (e.g., argon gas, about five volume percent hydrogen gas, and about 17 Torr water vapor).

In certain embodiments, such as when layer 12 is formed of a polycrystalline material, surface 15 can be thermally conditioned under conditions of relatively high oxygen gas pressure. Gases that can be used in these embodiments include, for example, air, pure oxygen, carbon monoxide, carbon dioxide, nitrogen oxides and mixtures of these gases.

During thermal conditioning, surface 15 is heated to a temperature sufficient to thermally condition surface 15. Typically, surface 15 is heated to a temperature at least about 5° C. above the deposition temperature or crystallization temperature of layer 14. Preferably, surface 15 is heated to a temperature of from about 15° C. to about 500° C. above the deposition temperature or crystallization temperature of layer 14, more preferably from about 75° C. to about 300° C. above the deposition temperature or crystallization temperature of layer 14, and most preferably from about 150° C. to about 300° C. above the deposition temperature or crystallization temperature of layer 14. For example, surface 15 can be heated to a temperature of from at least about 500° C. (e.g., at least about 800° C.) to a temperature of less than about than about 1200° C. (e.g., less than about 1050° C.).

In certain embodiments, the temperature of layer 14 may be increased (e.g., ramped) through some temperature range to attain the temperature at which layer 14 is thermally conditioned. For example, layer 14 may be ramped from about room temperature to some elevated temperature at which thermal conditioning occurs. In these embodiments, layer 14 is preferably increased at least about 5° C. above its deposition or crystallization temperature to attain the temperature at which thermally conditioning occurs, more preferably at least about 75° C. above its deposition or crystallization temperature, and most preferably at least about 150° C. above its deposition or crystallization temperature.

As will be appreciated by those skilled in the art, the times, temperatures and gas pressures used for thermally conditioning surface 15 can vary depending upon the particular conditions used. For example, when using a temperature of from about 800° C. to about 1050° C. and about 760 Torr of a forming gas formed of a mixture of argon and about 4 volume percent hydrogen that has less than about $1\times10^{-5}$ Torr of oxygen, surface 15 should be conditioned for at least about one second (e.g., at least about 30 seconds, such as from about 30 seconds to about 100 hours). Similar process conditions can also be used, for example, when surface 15 is conditioned with a forming gas that contains water vapor (e.g., argon, about five volume percent hydrogen and 17 Torr water).

Those skilled in the art will understand that the particular process parameters used to thermally condition a surface according to the invention should be at least sufficient to provide substantial improvement to the quality of the surface (e.g., increased smoothness, increased density, decreased contamination, and/or reduced rocking curve FWHM). Preferably, the surface is conditioned using process parameters sufficient to result in a surface that is biaxially textured, more preferably cube textured.

A high oxygen gas pressure can be used to condition surface 15 even when layer 12 is formed of an oxygen sensitive material by selecting the appropriate surface temperature, oxygen gas pressure and exposure time. For example, surface 15 can be conditioned for time periods shorter than about 5 minutes in about 760 Torr of pure oxygen at a temperature of about 950° C. These conditions can be appropriate to condition surface 15 without substantially oxidizing the material from which layer 12 is formed.

In some embodiments, surface 15 is conditioned using a method that involves chemical conditioning. Methods of chemically conditioning layer 15 include vacuum techniques (e.g., reactive ion etching, plasma etching and etching with fluorine-containing compounds, such as $BF_3$ and/or $CF_4$). Such techniques are known and are disclosed, for example, in *Silicon Processing for the VLSI Era*, Vol. I, eds. S. Wolf and R. N. Tanber, pages 539–574, Lattice Press, Sunset Park, Calif., 1986.

Surface 15 can also be chemically conditioned using solution phase techniques, such as disclosed in *Metallurgy and Metallurgical Engineering Series*, 3d ed., George L. Kehl, McGraw-Hill, 1949. In certain embodiments, chemically conditioning surface 15 includes contacting surface 15 with a relatively mild acid solution. Typically, in a mild acid solution, the acid concentration is less than about 10 percent (e.g., less than about two percent, or less than about one percent). Examples of mild acids include perchloric acid, nitric acid, hydrofluoric acid, hydrochloric acid, acetic acid and buffered acid solutions. A preferred acid solution is about one percent aqueous nitric acid. Halogen compositions (e.g., liquid halogens, such as bromine, fluorine or chlorine, either neat or in an appropriate solvent) can also be used to chemically condition surface 15.

As will be appreciated by those skilled in the art, the particular times and temperatures used during chemical conditioning can vary depending upon the manner in which surface 15 is chemically conditioned. For example, surface 15 can be chemically conditioned using a one percent aqueous nitric acid solution at room temperature for about two minutes. In some embodiments, chemical conditioning a surface can involve removing a layer of material disposed on the surface. For example, a layer of a superconductor intermediate (e.g., metal oxyfluoride) can be formed on the surface of an underlying layer (e.g., a buffer layer or a superconductor layer). The process of chemically conditioning the surface of the underlying layer can include removing the layer of superconductor intermediate (e.g., by exposure to a mild acid), and a new layer of superconductor material can then be formed on the conditioned surface to form the desired multi-layer article.

Those skilled in the art will understand that the particular process parameters used to chemically condition a surface according to the invention should be at least sufficient to provide substantial improvement to the quality of the surface (e.g., increased smoothness, increased density, decreased contamination, and/or reduced rocking curve FWHM). Preferably, the surface is conditioned using process parameters sufficient to result in a surface that is biaxially textured, more preferably cube textured.

Although the foregoing discussion describes chemical conditioning and thermal conditioning as two separate methods for conditioning surface 15 during the preparation of multi-layer article 10, the invention is not limited in this manner. Rather, these conditioning techniques can be combined when conditioning surface 15. Thus, for example, surface 15 can be thermally conditioned, then chemically conditioned. Alternatively, surface 15 can be chemically conditioned followed by being thermally conditioned. Surface 17 likewise may be thermally and/or chemically conditioned.

Layer 12 can be formed of any material capable of supporting layer 14. In embodiments in which article 10 is a multi-layer superconductor, layer 12 can be formed of a substrate material. Examples of substrate materials that can be used as layer 12 include, for example, metals and/or alloys, such as nickel, silver, copper, zinc, aluminum, iron, chromium, vanadium, palladium, molybdenum and/or their alloys. In certain embodiments, such as when article 10 is in the form of a relatively large surface area object (e.g., a wafer or a tape), layer 12 can exhibit high flexibility.

Surface 13 of layer 12 can also be prepared using vacuum processes, such as ion beam assisted deposition, inclined substrate deposition and other vacuum techniques known in the art to form a biaxially textured surface on, for example, a randomly oriented polycrystalline surface.

In some embodiments, a buffer layer 14 can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during IBAD of the buffer layer material can include, for example, a substrate temperature of from about 0° C. to about 400° C. (e.g., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

These methods are described in PCT Publication No. WO 99/25908, published on May 27, 1999, and entitled "Thin Films Having A Rock-Salt-Like Structure Deposited on Amorphous Surfaces," which is hereby incorporated by reference.

In other embodiments, the substrate can be formed of alloys having one or more surfaces that are biaxially textured (e.g., (113)[211]) or cube textured (e.g., (100)[001] or (100)[011]). The alloys can have a relatively low Curie temperature (e.g., at most about 80K, at most about 40K, or at most about 20K).

In these embodiments, the substrate can be a binary alloy that contains two of the following metals: copper, nickel, chromium, vanadium, aluminum, silver, iron, palladium, molybdenum, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). A binary alloy can further include relatively small amounts of impurities (e.g., less than about 0.1 atomic percent of impurities, less than about 0.01 atomic percent of impurities, or less than about 0.005 atomic percent of impurities).

Alternatively, in these embodiments, the substrate contains more than two metals (e.g., a ternary alloy or a quarternary alloy). For example, the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. The alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g. annealing and rolling, swaging and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g. Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

These methods are described in commonly owned U.S. patent application Ser. No. 09/283,775, filed Mar. 31, 1999, and entitled "Alloy Materials," commonly owned U.S. patent application Ser. No. 09/283,777, filed Mar. 31, 1999, and entitled "Alloy Materials," PCT Publication No. WO 99/17307, published on Apr. 8, 1999, and entitled "Substrates with Improved Oxidation Resistance," and PCT Publication No. WO 99/16941, published on Apr. 8, 1999, and entitled "Substrates for Superconductors," all of which are hereby incorporated by reference.

Preferably, surface 13 of layer 12 has a relatively well defined crystallographic orientation. For example, surface 13 can be a biaxially textured surface (e.g., a (113)[211] surface) or a cube textured surface (e.g., a (100)[011] surface or a (100)[001] surface). Preferably, the peaks in an X-ray diffraction pole figure of surface 13 have a FWHM of less than about 20° (e.g., less than about 15°, less than about 10°, or from about 5° to about 10°).

In some embodiments, stable oxide formation can be mitigated until a first epitaxial (for example, buffer) layer is formed on the biaxially textured alloy surface, using an intermediate layer disposed on the surface of the substrate. Intermediate layers suitable for use in the present invention include those epitaxial metal or alloy layers that do not form surface oxides when exposed on conditions as established by $P_{O2}$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In certain of these embodiments, the intermediate layer is transient in nature "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and or copper. Epitaxial films or layers deposited on an intermediate layer can include metal oxides, chalcogenides, halides, and nitrides. In preferred embodiments, the intermediate metal layer does not oxidize under epitaxial film deposition conditions.

Care should be taken that the deposited intermediate layer is not completely incorporated into a does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

Layer 14 can be formed of a buffer material (e.g., a metal oxide buffer), a superconductor material (e.g., an oxide superconductor material) or a precursor of a superconductor material (e.g., a precursor of an oxide superconductor material).

Examples of buffer materials include metals and metal oxides, such as silver, nickel, $TbO_N$, $GaO_N$, $CeO_2$, yttria-stabilized zirconia (YSZ), $Y_2O_3$, $Gd_2O_3$, $LaAlO_3$, $SrTiO_3$, $LaNiO_3$, $LaCuO_3$, $SrRuO_3$, $NdGaO_3$, $NdAlO_3$ and or nitrides as known to those skilled in the art. A buffer material can be prepared using solution phase techniques, including metalorganic deposition, which are known to those skilled in the art. Such techniques are disclosed in, for example, S. S. Shoup et al., J. Am. Cer. Soc., vol. 81.3019; D. Beach et al., Mat. Res. Soc. Symp. Proc., vol. 495.263 (1988), M. Paranthaman et al., Superconductor Sci. Tech. vol. 12.319 (1999); D. J. Lee et al., Japanese J. Appl. Phys., vol. 38.L178 (1999) and M. W. Rupich et al., I.E.E.E. Trans. on Appl. Supercon. vol. 9, 1527.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

If the substrate underlying an oxide layer is insufficiently covered by a precursor solution used to make the oxide layer, then the oxide layer may not provide the desired protection of the substrate from oxidation during deposition of the subsequent oxide layers when carried out in an oxidizing atmosphere relative to the substrate and may not provide a complete template for the epitaxial growth of subsequent layers. By heating a sol gel precursor film, and thereby allowing the precursor to flow into the substrate grain boundary areas, complete coverage can result. The heating can be relatively low temperature, for example, from about 80° C. to about 320° C. for example, from about 100° C. to about 300° C. or from about 100° C. to about 200° C. Such temperatures can be maintained from about 1 to about 60 minutes, for example, from about 2 to about 45 minutes, or from about 15 to about 45 minutes. The heating step can also be carried out using higher temperatures for a shorter time, for example, a film can be processed within two minutes at a temperature of 300° C.

This heating step can be carried out after, or concurrently with, the drying of excess solvent from the sol gel precursor film. It must be carried out prior to decomposition of the precursor film, however.

The carbon contamination accompanying conventional oxide film preparation in a reducing environment (e.g., 4% $H_2$-Ar) is believed to be the result of an incomplete removal of the organic components of the precursor film. The presence of carbon-containing contaminants $C_xH_y$ and $C_2H_3O_2$ in or near the oxide layer can be detrimental, since they can alter the epitaxial deposition of subsequent oxide layers. Additionally, it is likely that the trapped carbon-containing contaminants buried in the film can be oxidized during the processing steps for subsequent oxide layers, which can utilize oxidizing atmospheres. The oxidation of the carbon-containing contaminants can result in $CO_2$ formation, and the subsequent blistering of the film, and possible delamination of the film, or other defects in the composite structure. Thus, it is undesirable to allow carbon-containing contaminants arising from metal alkoxide decomposition to become oxidized only after the oxide layer is formed. Preferably, the carbon-containing contaminants are oxidized (and hence removed from the film structure as $CO_2$) as the decomposition occurs. Also the presence of carbon-containing species on or near film surfaces can inhibit the epitaxial growth of subsequent oxide layers.

According to particular embodiments, after coating a metal substrate or buffer layer, the precursor solution can be air dried, and then heated in an initial decomposition step. Alternatively, the precursor solution can be directly heated in an initial decomposition step, under atmosphere that is reduced relative to the metal substrate. Once the oxide layer initially nucleates on the metal substrate in the desired epitaxial orientation, the oxygen level of the process gas is increased, for example, by adding water vapor or oxygen. Then nucleation step requires from about 5 minutes to about 30 minutes to take place under typical conditions.

These methods are described in commonly owned U.S. patent application Ser. No. 09/617,520, filed on even date herewith, and entitled "Enhanced Purity Oxide Layer Formation," which is hereby incorporated by reference.

In certain embodiments, an epitaxial buffer layer can be formed using a low vacuum vapor deposition process (e.g., a process performed at a pressure of at least about $1 \times 10^{-3}$ Torr). The process can include forming the epitaxial layer using a relatively high velocity and or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1 \times 10^{-3}$ Torr, such as less than about $1 \times 10^{-4}$ Torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1 \times 10^{-3}$ Torr, at least about 0.1 Torr, or at least about 1 Torr) at a surface temperature below the temperature used to grow the epitaxial layer using physical vapor deposition at a high vacuum (e.g., at most about $1 \times 10^{-4}$ Torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022,832 issued Feb. 8, 2000, and entitled "Low Vacuum Process for Producing Superconductor Articles with Epitaxial Layers;" and/or commonly owned U.S. patent application No. 09/007,372, filed Jan. 15, 1998, and entitled "Low Vacuum Process for Producing Epitaxial Layers of Semiconductor Material," all of which are hereby incorporated by reference.

In some embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^-$ toward a substrate surface. Preferably, gridded ion sources with beam voltages greater than 150 ev are utilized. Alternatively, a plasma can be established in a region near the substrate surface. Within this region, ions chemically interact with a substrate surface to remove material from that surface, including metal oxides, to produce substantially oxide-free metal surfaces.

Another method to remove oxide layers from a substrate is to electrically bias the substrate. If the substrate tape or wire is made negative with respect to the anode potential, it will be subjected to a steady bombardment by ions from the gas prior to the deposition of the target is shuttered) or during the entire film deposition. This ion bombardment can clean the wire or tape surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a wire or tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C. preferably 500° C. to 800° C. and more preferably 200° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate wire or tape must be moving or transferring between deposition stations during the process. According to particular embodiments, the substrates are heated by resistive heating, that is, by passing a current through the metal substrate, which is easily sealable to long length manufacturing processes. This approach works well while instantaneously allowing for rapid travel between these zones. Temperature control can be accomplished by using optical pyrometers and closed loop feedback systems to control the power supplied to the substrate being heated. Currently can be supplied to the substrate by electrodes which contact the substrate in at least two different segments of the substrate. For example, if the substrate, in the form of a tape or wire, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the tape between current wheels.

In order that the deposition is carried out on tape that is at the appropriate temperature, the metal or oxide material that is deposited onto the tape is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the tape is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000, and entitled "Oxide Layer Method," and commonly owned U.S. patent application Ser. No. 09/615,669, filed on even date herewith, and entitled "Oxide Layer Method," both of which are hereby incorporated by reference in their entirety.

In preferred embodiments, three buffer layers are used. A layer of $Y_2O_3$ or $CeO_2$ (e.g., from about 20 nanometers to about 50 nanometers thick) is deposited (e.g., using electron beam evaporation) onto the substrate surface. A layer of YSZ (e.g., from about 0.2 micron to about 1 micron thick, such as about 0.5 micron thick) is deposited onto the surface of the $Y_2O_3$ layer using sputtering (e.g. using magnetron sputtering). A $CeO_2$ layer (.e.g, about 20 nanometers thick) is deposited (e.g. using magnetron sputttering) onto the YSZ surface. The surface of one or more of these layers can be chemically and/or thermally conditioned as described herein.

Alternatively, layer 14 can be formed of a superconductor material. Examples of superconductor materials include rare earth-barium-copper-oxides (REBCO), such as YBCO (e.g., $YBa_2Cu_3O_{7-x}$), bismuth-stronium-calcium-copper-oxides, thallium, and/or mercury based superconductors.

In certain embodiments, layer 14 is formed of $YBa_2Cu_3O_{7-x}$ prepared according to a method that includes first depositing a precursor of $YBa_2Cu_3O_{7-x}$ onto surface 13 then reacting the precursor to form $YBa_2Cu_3O_{7-x}$.

The superconductor layer can be formed from a precursor composition that has a relatively small amount of free acid. In aqueous solutions, this can correspond to a precursor composition with a relatively neutral pH (e.g., neither strongly acidic not strongly basic). The precursor composition can be used to prepare multi-layer superconductors using a wide variety of materials which can be used as the underlying layer on which the superconductor layer is formed.

The total free acid concentration of the precursor composition can be less than about $1 \times 10^{-3}$ molar (e.g., less than about $1 \times 10^{-5}$ molar or about $1 \times 10^{-7}$ molar). Examples of free acids that can be contained in a precursor composition include trifluoroacetic acid, acetic acid, nitric acid, sulfuric acid, acids of iodides, acids of bromides and acids of sulfates.

When the precursor composition contains water, the precursor composition can have a pH of at least about 3 (e.g., at least about 5 or about 7).

In some embodiments, the precursor composition can have a relatively low water content (e.g., less than about 50 volume percent water, less than about 35 volume percent water, less than about 25 volume percent water).

In embodiments in which the precursor composition contains trifluoroacetic acid and an alkaline earth metal (e.g., barium), the total amount of trifluoroacetic acid can be selected so that the mole ratio of fluorine contained in the precursor composition (e.g., in the form of trifluoroacetate) to the alkaline earth metal (e.g., barium ions) contained in the precursor composition is at least about 2:1 (e.g., from about 2:1 to about 18.5:1, or from about 2:1 to about 10:1).

Superconducting articles formed from such precursor compositions can include more than one superconductor layer (e.g., two superconductor layers disposed on each other). The combined thickness of the superconductor layers can be at least about one micron (e.g., at least about two microns, at least about three microns, at least about four microns, at least about five microns, or at least about six microns). The combined critical current density of the superconductor layers can be at least about $5 \times 10^5$ Amperes per square centimeter (e.g., at least about $1 \times 10^6$ Amperes per square centimeter, or at least about $2 \times 10^6$ Amperes per square centimeter).

In general, the precursor compositions can be prepared by combining soluble compounds of a first metal (e.g. copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the precursor compositions. Such compounds include, for example, salts (e.g., nitrates, acetates, alkoxides, iodides, sulfates and trifluoroacetates), oxides and hydroxides of these metals.

These methods and compositions are described in commonly owned U.S. Provisional patent application Ser. No. 60/166,297, filed on Nov. 18, 1999, and entitled "Superconductor Articles and Compositions and Methods for Making Same," and commonly owned U.S. patent application No. 09/616,810, filed on even date herewith, and entitled "Multilayered Articles and Methods for Making Same," both of which are hereby incorporated by reference.

In other embodiments, a superconductor material can be formed from a precursor solution formed of an organic solution containing metal trifluoroacetates prepared from powders of $BaCO_3$, $YCO_3 \cdot 3H_2O$ and $Cu(OH)_2CO_3$ which are combined and reacted using methods known to those skilled in the art. For example, the powders can be combined in a 2:1:3 ratio with between 20–30% (5.5–6.0 M) excess trifluoroacetic acid in methyl alcohol and then refluxed (e.g., for approximately four to ten hours) to produce a solution substantially 0.94 M based on copper content.

The precursor solution can then applied to a surface (e.g., a buffer layer surface), such as by spin coating or other techniques known to those skilled in the art.

After application to the surface (e.g. the buffer layer surface), the precursor solution is heat treated. Generally, the solution can be heated at a rate of from about 0.5° C. per minute to about 10° C. per minute in moist oxygen (e.g., having a dew point in the range of from about 20° C. to about 75° C.) to a temperature in the range of from about 300° C. to about 500° C. The coating can then heated for about one hour to a temperature of less than about 860° C. (e.g., less than about 810° C.) in a moist reducing nitrogen-oxygen gas mixture (e.g., having a composition including from about 0.5% to about 5% oxygen). Optionally, the coating can be further heated to a temperature of from about 860° C. to about 950° C. for from about five to about 25 minutes. The coating can be subsequently heated to a temperature of from about 400° C. to about 500° C. for at least about eight hours at in dry oxygen. The coating can then be cooled to room temperature in static dry oxygen.

These methods are described in U.S. Pat. No. 5,231,074, issued on Jul. 27, 1993, and entitled "Preparation of Highly Textured Oxide Superconducting Films from MOD Precursor Solutions," which is hereby incorporated by reference.

In one some embodiments, a superconductor is prepared by depositing a metal oxyfluoride using one or more standard technique, such as metalorganic solution deposition, metalorganic chemical vapor deposition, reactive evaporation, plasma spray, molecular beam epitaxy, laser ablation, ion beam sputtering, electron beam evaporation, or depositing a metal trifluoroacetate coating and decomposing the coating as described herein. Multiple layers of metal oxyfluoride may be deposited.

In these embodiments, other constituent metallic elements of the desired oxide superconductor are also deposited in substantially stoichiometric proportions.

The metal oxyfluoride is then converted into an oxide superconductor at a rate of conversion selected by adjusting temperature, vapor pressure of gaseous water or both. For example, the metal oxyfluoride can be converted in a processing gas having a moisture content of less than 100% relative humidity (e.g., less than about 95% relative humidity, less than about 50% relative humidity, or less than about 3% relative humidity) at 25° C. to form some oxide superconductor, then completing the conversion using a processing gas having a higher moisture content (e.g., from about 95% relative humidity to about 100% relative humidity at 25° C.). The temperature for converting the metal oxyfluoride can be in the range of from about 700° C. to about 900° C. (e.g. from about 700° C. to about 835° C.). The processing gas preferably contains from about 1 volume percent oxygen gas to about 10 volume percent oxygen gas.

These methods are described in PCT Publication No. WO 98/58415, published on Dec. 23, 1998, and entitled "Controlled Conversion of Metal Oxyfluorides into Superconducting Oxides," which is hereby incorporated by reference.

In alternate embodiments, the preparation of the superconductor layer includes using a precursor composition containing a trifluoroacetate salt of one or more metals and a controlled total water content (e.g., controlled content of liquid water in the precursor composition and controlled content of water vapor in the surrounding environment) present when treating the precursor composition to form an intermediate of the superconductor layer (e.g., metal oxyfluoride intermediate of the superconductor layer). For example, the precursor composition can have a relatively low water content (e.g., less than about 50 volume percent water, less than about 35 volume percent water, or less than about 25 volume percent water) and or a relatively high solids content, whereas the surrounding gas environment can have a relatively high vapor pressure of water (e.g., from about 5 Torr to about 50 Torr water, from about 5 Torr to about 30 Torr water, or from about 10 Torr to about 25 Torr water). The superconductor layer intermediate (e.g., metal oxyfluoride intermediate) can be formed in a relatively short period of time (e.g., less than about five hours, less than about three hours, or less than about one hour).

Treating the precursor composition can include heating the precursor composition from an initial temperature (e.g., room temperature) to a temperature of from about 190° C. to about 215° C. (e.g., about 210° C.) at a rate of at least about 5° C. per minute (e.g., at least about 8° C. per minute, or at least about 10° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

Heating is then continued to a temperature of from about 220° C. to about 290° C. (e.g., about 220° C.) at a rate of from about 0.05° C. per minute to about 0.4° C. per minute (e.g., from about 0.1° C. per minute to about 0.4° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example from about 0.1 Torr to about 760 Torr.

This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) or form an intermediate of the superconductor material (e.g., a metal oxyfluoride intermediate). The nominal partial pressure of oxygen can be, for example, from about 0.1 Torr to about 760

The intermediate can be heated to form the desired superconductor layer. For example, the intermediate can be heated to a temperature of from about 700° C. to about 825° C. in an environment containing from about 0.1 Torr to about 50 Torr oxygen and from about 0.1 Torr to about 150 Torr water vapor (e.g., about 12 Torr water vapor) with the balance being, for example, nitrogen and/or argon.

The method can result in a well-ordered superconductor layer (e.g., biaxially textured or cube textured) having a relatively high critical current density (e.g., at least about $50 \times 10^5$ Amperes per square centimeter).

These methods are described in commonly owned U.S. Provisional Patent Application Ser. No. 60/166,145, filed on Nov. 18, 1999, and entitled "Methods and Compositions for Making a Multi-Layer Article," and commonly owned U.S. patent application No. 09/615,991, filed on even date herewith, and entitled "Methods and Compositions for Making a Multi-layer Article," both of which are hereby incorporated by reference.

In other embodiments, a metal oxyfluoride intermediate of a superconductor material can be prepared using a process that involves relatively few temperature ramps (e.g., less than three ramps, so as two ramps).

Alternatively or additionally, forming the metal oxyfluoride can include one or more steps in which the temperature is held substantially constant (e.g., constant within about 10° C. within about 5° C. within about 2° C. within about 1° C.) for a relatively long period of time (e.g., more than one minute, more than about five minutes, more than about 30 minutes, more than about an hour, more than about two hours, more than about four hours) after a first temperature ramp to a temperature greater than about room temperature (e.g., at least about 50° C., at least about 100° C., at least about 200° C., at least about 215° C., from about 215° C,. to about 225° C., about 220° C.).

Formation of the metal oxyfluoride intermediate can involve using more than one gas environment (e.g., a gas environment having a relatively high water vapor pressure and a gas environment having a relatively low water vapor pressure) while maintaining the temperature substantially constant (e.g. constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours) As an example, in a high water vapor pressure environment, the water vapor pressure can be from about 5 Torr to about 40 Torr (e.g., from about 17 Torr to about 38 Torr, such as about 32 Torr or about 17 Torr). A low water vapor pressure environment can have a water vapor pressure of less than about 1 Torr (e.g., less than about 0.1 Torr. less than about 10 milliTorr, about five milliTorr).

Generally, the metal oxyfluoride is formed by disposing a composition (e.g., a precursor solution) on a surface (e.g., a substrate surface, a buffer layer surface or a superconductor layer surface) and heating the composition. The methods of disposing the composition on the surface include spin coating, dip coating, web coating and other techniques known in the art.

Typically, in an initial decomposition step, the initial temperature in this step is about room temperature, and the final temperature is from about 215° C. to about 225° C. using a temperature ramp of 10° C. per minute or less. During this step, the partial pressure of water vapor in the nominal gas environment is preferably maintained at from about 5 Torr to about 40 Torr. The partial pressure of oxygen in the nominal gas environment can be maintained at from about 0.1 Torr to about 760 Torr. The temperature and nominal gas environment are then held substantially constant for a relatively long period of time.

After this time period, the gas environment is changed to a relatively dry gas environment (e.g., less than about one Torr water vapor, less than about 0.1 Torr water vapor, less than about 10 milliTorr water vapor, five milliTorr water vapor) while maintaining the temperature substantially constant. The temperature and nominal gas environment are then held substantially constant for a relatively long period of time.

After this time period, the nominal gas environment is maintained substantially constant and heating is continued to a temperature sufficient to form the metal oxyfluoride intermediate (e.g., about 400° C.). This step is preferably performed using a temperature ramp of 10° C. per minute or less.

The metal oxyfluoride intermediate can then be heated to form the desired superconductor layer. Typically, this step is performed by heating to a temperature of from about 700° C. to about 825° C. During this step, the nominal gas environment typically can contain from about 0.1 Torr to about 50 Torr oxygen and from about 0.1 Torr to about 150 Torr (e.g., about 12 Torr) of water vapor with the balance being nitrogen and/or argon.

Preferably, the metal oxyfluoride intermediate has a relatively low defect density.

These methods are described in commonly owned U.S. patent application Ser. No. 09/616,811, filed on even date herewith, and entitled "Methods of Making a Superconductor." which is hereby incorporated by reference.

In alternate embodiments, the superconducting layer can be formed from solid-state, or semi-solid state, precursor materials deposited in the form of a dispersion. These precursor compositions allow for example the substantial elimination of $BaCO_3$ formation in final YBCO superconducting layers, while also allowing control of film nucleation and growth.

Two general approaches are presented for the formulation of these precursor compositions. In one approach, the cationic constituents of the precursor composition are provided in components taking on a solid form, either as elements, or preferably, compounded with other elements. The precursor composition is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor composition can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth barium/copper oxyfluoride in a substantially stoichiometric mixture. Analysis of such particles would desirably reveal a rare-earth:barium:copper ratio as substantially 1-2-3 in stoichiometry, with a fluorine-barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{6-8}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metalorganic solution comprising a substantially stoichiometric mixture of desired REBCO constituents could be used to produce the ultrafine particles used in the precursor compositions. Alternatively, one or more of the cationic constituents can be provided with the precursor composition as a metalorganic salt or metalorganic compound, and can be present in solution. The metalorganic solution can act as a solvent, or carrier, for the other solid-state elements or compounds. According to this embodiment, dispersants and/or binders can be substantially eliminated from the precursor composition. For example, the precursor composition can comprise ultrafine particles of rare-earth oxide and copper oxide in substantially a 1:3 stoichiometric ratio, along with a solubilized barium-containing salt, for example, barium-trifluoroacetate dissolved in an organic solvent, such as methanol.

If the superconducting layer is of the REBCO type, the precursor composition can contain a rare earth element, barium, and copper in the form of their oxides: halides such as fluorides, chlorides, bromides and iodides; carboxylates and a alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper (oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_C$ of no less than about 89K, and $J_C$ greater than about 500,000 A/cm$^2$ at a film thickness of 1 micron or greater. For example, for a $YBa_2Cu_3O_{6-8}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Ba-trifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium fluoroacetate. In some embodiments the precursor could be substantially a solubilized metalorganic salt containing some or all of the cation constituents, provided at least a portion of one of the compounds containing cation constituents present in solid form. In certain embodiments, the precursor in a dispersion includes a binder and/or a dispersant and/or solvent(s).

These precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying. The substrate is desirably uniformly coated to yield a superconducting film of from about 1 to 10 microns, preferably from about 1 to 5 microns, more preferably from about 2 to 4 microns.

More details are provided in commonly owned U.S. patent application Ser. No. 09/500,717, filed on Feb. 9, 2000, and entitled "Coated Conductor Thick Film Precursor," which is hereby incorporated by reference in its entirety.

In particular embodiments, methods can be employed to minimize the formation of undesirable a-axis oriented oxide layer grains, by inhibiting the formation of the oxide layer until the required reaction conditions are attained.

Conventional processes developed for decomposition and reaction of fluoride-containing precursors use a constant, and low, non-turbulent flow of process gas that is introduced into the decomposition furnace in an orientation that is parallel to the film surface, resulting in a stable boundary layer at the film/gas interface. In the apparatus types typically used for oxide layer precursor decomposition and reaction, the diffusion of gaseous reactants and products through this gas/film boundary layer appears to control the overall reaction rates. In thin, small area films (for example, less than about 0.4 microns thick and less than about a square centimeter), the diffusion of $H_2O$ into the film and the diffusion of HF out of the film occur at rates such that the formation of the $YBa_2Cu_3O_{7-N}$ phase does not begin at any significant rate until the sample reaches the processing temperature. However, as the film thickness or area increases, the rates of gaseous diffusion into and out of the film decrease, all other parameters being equal. This results in longer reaction times and/or incomplete formation of the $YBa_2Cu_3O_{7-N}$ phase, resulting in reduced crystallographic texture, lower density, and reduced critical current density. Thus, the overall rate of $YBa_2Cu:O_{7-N}$ phase formation is determined, to a significant extent, by the diffusion of gases through the boundary layer at the film surface.

One approach to eliminating these boundary layers is to produce a turbulent flow at the film surface. Under such conditions, the local gas composition at the interface is maintained essentially the same as in the bulk gas (that is, the $pH_2O$ is constant, and the pHF is approximately zero). Thus the concentration of the gaseous products/reactants in the film is not controlled by the diffusion through the gas film surface boundary layer condition, but rather by diffusion through the film. In order to minimize the nucleation of a-axis $YBa_2Cu_3O_{7-N}$ oriented grains on a substrate surface, the formation of the $YBa_2Cu_3O_{7-N}$ phase is inhibited until desired process conditions are reached. For example, the formation of the $YBa_2Cu_3O_{7-N}$ phase can be inhibited until desired process temperature is reached.

In one embodiment, a combination of: 1) low (non-turbulent) process gas flow, so that a stable boundary layer is established at the film/gas interface, during the ramp to temperature, and 2) high (turbulent) process gas flow, so that the boundary layer is disrupted at the film/gas interface, is employed. For example, in a three inch tube furnace, the flow can be from about 0.5 to about 2.0 L/min during the temperature ramp from ambient temperature to the desired process temperature. Thereafter, the flow can be increased to a value of from about 4 to about 15 L/min during the time at which the film is being processed. Thus, the rate of formation of $YBa_2Cu_3O_{7-N}$ and epitaxial texture formation can be increased at high temperature, while minimizing the amount of unwanted a-axis nucleation and growth at low temperature during ramp up. According to these process, a-axis nucleated grains are desirably present in an amount of less than about 1%, as determined by scanning electron microscopy.

More details are provided in commonly owned U.S. patent application Ser. No. 09/616,566, filed on even date herewith, and entitled "Control of Oxide Layer Reaction Rates," which is hereby incorporated by reference.

In embodiments in which layer 14 is formed of a superconductor material, layer 14 can have a relatively high critical current density. For example, layer 14 can have a critical current density of at least about $1 \times 10^h$ Amperes per square centimeter (e.g. at least about $1.5 \times 10^6$ Amperes per square centimeter, such as at least about $2 \times 10^6$ Amperes per square centimeter) as determined by transport measurement at 77K in self field (i.e., no applied field) using a one micro Volt per centimeter criterion.

Subsequent to conditioning, surface 15 of layer 14 can have a well defined crystallographic orientation. Preferably, surface 15 is a biaxially textured surface (e.g., a (113) [221] surface), such as a cube textured surface (e.g., a (100)[011] surface or a (100)[001] surface). Preferably, the peaks in an X-ray diffraction pole figure of surface 15 have a FWHM of less than about 20° (e.g. less than about 15°, less than about 10°, or from about 5° to about 10°).

Layer 16 can be formed of a buffer material, a superconductor material, a precursor of a superconductor material or a cap material. Preferably, layer 16 is an epitaxial layer.

Examples of a cap materials include metals or alloys whose reaction products with the superconductor material (e.g., $YBa_2Cu_3O_{7-N}$) are thermodynamically unstable under the reaction conditions used to prepare layer 16. Exemplary cap materials include silver, gold, palladium and platinum.

Surface 17 of layer 16 can be chemically conditioned or thermally conditioned as described herein. Accordingly, layer 17 can exhibit the properties of a conditioned surface as described herein.

Figure 2:
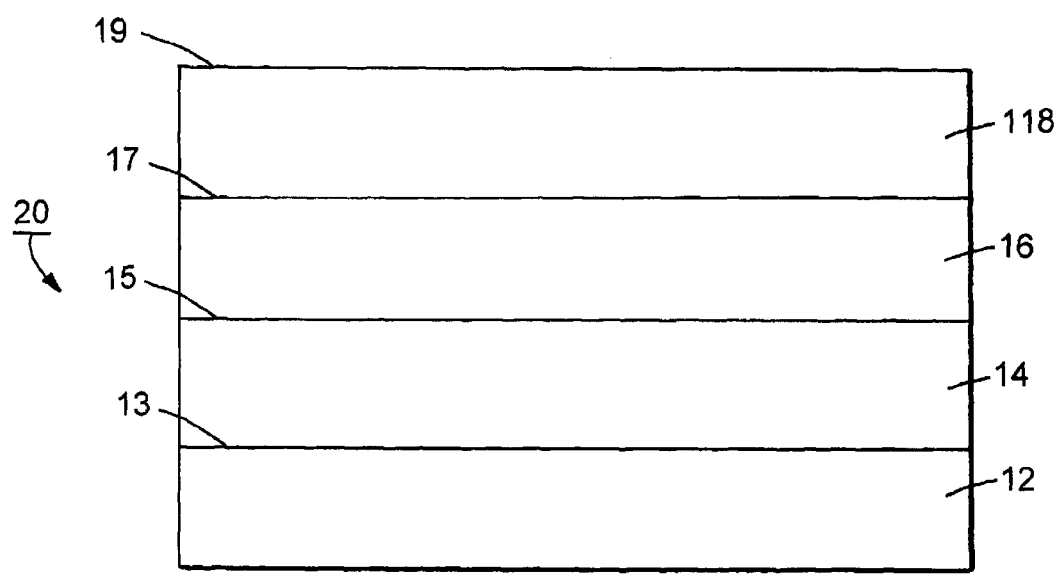
FIG. 2 is a cross-sectional view of another embodiment of a multi-layer article.

FIG. 2 shows an embodiment of a multi-layer article 20 (e.g., a wafer or a tape) that can be formed by the methods of the invention. Article 20 includes layers 12, 14, 16 and 18. Layer 18 has a surface 19, and is disposed on surface 17 of layer 16. Surfaces 15, 17 and or 19 can be conditioned surfaces having the properties and being prepared as described herein.

Layer 18 can be formed of a buffer material, a cap material, a superconductor material, or a precursor of a superconductor material.

The layer(s) of superconductor material in article 20 can have a relatively high critical current density as described herein.

Although the foregoing discussion describes a multi-layer article having three layers (i.e. one intermediate layer) and four layers (i.e., two intermediate layers) the invention is not limited in this sense. Instead, the multi-layer article can have more than four layers (i.e., more than three intermediate layers). The intermediate layers can be formed of any combination of buffer layers and/or superconductor layers. Any combination of the surfaces of the intermediate layers can be conditioned according to the methods described herein and exhibit the properties described herein. Multi-layer superconductors including these intermediate layers can exhibit the relatively high critical current densities described herein. In addition, while the foregoing discussion has described multi-layer articles having certain structures, the invention is not limited in this sense. For example, in some embodiments, multi-layer high temperature superconductors are provided, including first and second high temperature superconductor coated elements. Each element includes a substrate, at least one buffer layer deposited on the substrate, a high temperature superconductor layer, and optionally a cap layer. The first and second high temperature superconductor coated elements can be joined at the first and second cap layers, or can be joined with an intervening, preferably metallic, layer. Exemplary joining techniques include soldering and diffusion bonding.

Such a multi-layer architecture provides improved current sharing, lower hysteretic losses under alternating current conditions, enhanced electrical and thermal stability, and improved mechanical properties. Useful conductors can be made having multiple tapes stacked relative to one another and or laminated to provide sufficient ampacity, dimensional stability, and mechanical strength. Such embodiments also provide a means for splicing coated tape segments and for termination of coated taped stackups or conductor elements.

Moreover, it is expected that this architecture can provide significant benefits for alternating current applications. AC losses are shown to be inversely proportional to the effective critical current density within the conductor, more specifically, the cross-sectional area within which the current is carried. For a multifilimentary conductor, this would be the area of the "bundle" of superconducting filaments, excluding any sheath material around that bundle. For a "face-to-face" architecture, the "bundle" critical current density would encompass only the high temperature superconductor films and the thickness of the cap layer structure. The cap layer can be formed of one or more layers, and preferably includes at least one noble metal layer, "Nobel metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, the cap layer can include a second layer of normal metal (for example, copper or aluminum or alloys of normal metals). In direct current applications, additional face-to-face wires would be bundled or stacked to provide for the required ampacity and geometry for a given application.

Additionally, the high temperature superconductor film on the surface of the tapes could be treated to produce local breaks, that is, non-superconducting regions or stripes in the film only along the length of the tape (in the current flow direction). The cap layer deposited on the high temperature superconductor film would then serve to bridge the nonsuperconducting zones with a ductile normal metal region. An offset in the edge justification of the narrow strips or filaments, similar to a running bond brick pattern, would allow current to transfer to several narrow superconducting filaments both across the cap layers and to adjacent filaments, further increasing the redundancy and improving stability.

In all embodiments, a normal metal layer could be included along the edge of the conductor to hermetically seal the high temperature superconductor films and to provide for current transfer into the film, and if necessary, from the film into the substrate.

More details are provided in commonly owned U.S. Provisional Patent Application Ser. No. 60/145,468, filed on Jul. 23, 1999, and entitled "Enhanced High Temperature Coated Superconductors," and commonly owned U.S. patent application Ser. No. 09/617,518, filed concurrently herewith, and entitled "Enhanced High Temperature Coated Superconductors," both of which are hereby incorporated by reference in its entirety.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bilayered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

More details are provided in commonly owned U.S. patent application Ser. No. 09/500,718, filed on Feb. 9, 2000, and entitled "Coated Conductors with Reduced AC Loss," which is hereby incorporated by reference in its entirety.

The following examples are illustrative only. In these examples, magnetron sputtering was conducted using a magnetron sputtering power density of from about 25 Watts per square inch to about 50 Watts per square inch and a chamber pressure of from about 10 milliTorr to about 25 milliTorr.

EXAMPLE I

A precursor solution was prepared as follows. About 51.4 grams of $Y(CH_3CO_2)_3 \cdot 4H_2O$ were dissolved in about 514 grams of water. About 77.6 grams of $Ba(CH_3CO_2)_2$ were dissolved in about 388 grams of water, and about 91 grams of $Cu(CH_3CO_2)_2 \cdot H_2O$ were dissolved in about 1365 grams of water. These three solutions were then mixed together. About 243 grams of the resulting solution were mixed with about 10 milliliters of pure trifluoroacetic acid. This solution was dried under vacuum at about 60° C. until all solvents were removed and only a solid remained. The solid was then dissolved in methanol and diluted to a total volume of about 50 milliliters to form a precursor solution.

EXAMPLE II

A multi-layer article was prepared as follows. The precursor solution prepared in Example I was spin coated onto a buffered substrate formed of $CeO_2/YSZ/CeO_2/Ni$.

The buffered substrate was prepared by rolling deformation of a nickel sample to greater than about 97% to form a tape. The tape was annealed at about 1000° C. for about an hour to form a well cube textured material. An about 30 nanometer thick layer of $CeO_2$ was deposited onto the textured nickel surface at a rate of about one Angstrom per second using electron beam evaporation and a temperature of about 625° C. An about 300 nanometer thick layer of YSZ was deposited on the $CeO_2$ layer at a rate of about 0.5 Angstroms per second using radio frequency sputtering at a temperature of about 725° C. An about 20 nanometer thick layer of $CeO_2$ was deposited on the YSZ layer at a rate of about 0.7 Angstroms per second using radio frequency sputtering and a temperature of about 725° C. The buffered $CeO_2/YSZ/CeO_2/Ni$ substrate was cut into two portions.

The spin coating protocol was as follows. One portion of the buffered $CeO_2/YSZ/CeO_2/Ni$ substrate was ramped from about zero revolutions per minute (RPM) to about 2000 RPM in about 0.5 second. The spin speed was held at about 2000 RPM for about five seconds and then ramped to about 4000 RPM in about 0.5 second. The spin speed was held at about 4000 RPM for about 60 seconds then reduced to about zero RPM.

The coated sample was decomposed as follows. The sample was heated from room temperature to about 210° C. at a rate of about 10° C. per minute in a nominal gas environment having a total gas pressure of about 760 Torr (water vapor pressure of about 24 Torr and balance oxygen). Heating was conducted in an about 2.25" diameter furnace using a gas flow rate of about 4.5 standard cubic feet per hour. While keeping substantially the same nominal gas environment, the temperature was increased to about 220° C. at a rate of about 0.05° C. per minute, followed by heating to about 400° C. at a rate of about 5° C. per minute to form an intermediate layer.

After decomposition, the intermediate layer was heated to about 725° C. at a rate of about 10° C. per minute and held for about three hours in an environment having a nominal total gas pressure of about 760 Torr (water vapor pressure of about 17 Torr. oxygen gas pressure of about 76 milliTorr and balance nitrogen), followed by holding the temperature at about 725° C. for about 10 minutes in an environment having a nominal total gas pressure of about 760 Torr (oxygen gas pressure of about 76 milliTorr and balance nitrogen). The layer was then cooled to about 450° C. in the same nominal gas environment. The layer was held at about 450° C. about one hour in a gas environment having a nominal total pressure of about 760 Torr (about 760 Torr oxygen), and subsequently cooled to room temperature.

The resulting layer was formed of $YBa_2Cu_3O_{7-N}$, and was about 0.4 micron thick. The layer had a critical current density of about $0.85 \times 10^6$ Amperes per square centimeter as determined by transport measurement at 77K in self field using a one microvolt per centimeter criterion.

EXAMPLE III

A multi-layer article was prepared as follows. The unused portion of the $CeO_2/YSZ/CeO_2/Ni$ buffered substrate prepared in Example II was held at about 900° C. for about one hour in a gas environment having a nominal total gas pressure of about 760 Torr of a forming gas (about four volume percent hydrogen in argon). The gas environment had a nominal oxygen gas pressure of from about $1 \times 10^{-12}$ Torr to about $1 \times 10^{-16}$ Torr. A precursor solution prepared as described in Example I was spin coated onto the conditioned surface of the $CeO_2/YSZ/CeO_2/Ni$ buffered substrate, decomposed and further heated as described in Example II. The resulting $YBa_2Cu_3O_{7-N}$ layer had a critical current density of about $1.34 \times 10^6$ Amperes per square centimeter as determined by transport measurement at 77K in self field using a one microvolt per centimeter criterion.

EXAMPLE IV

A multi-layer article was prepared as follows. A buffered substrate was prepared using the process parameters described in Example II except that: 1.) the $CeO_2$ layer adjacent the textured nickel substrate was replaced with an about 100 nanometer thick layer of $Y_2O_3$ deposited at a rate of about one Angstrom per second using electron beam evaporation and a temperature of about 700° C.; and 2.) the outer layer of $CeO_2$ was deposited at a rate of about 0.35 Angstroms per second. The $CeO_2$ YSZ $Y_2O_3$ Ni buffered substrate was cut into two portions. A precursor solution prepared as described in Example I was spin coated onto one portion of the $CeO_2/YSZ/Y_2O_3/Ni$ buffered substrate, decomposed and further heated using the protocol described in Example II. The $YBa_2Cu_3O_{7-N}$ layer had a critical current density of about $0.43 \times 10^6$ Amperes per square centimeter as determined by transport measurement at 77K in self field using a one microvolt per centimeter criterion.

EXAMPLE V

A multi-layer article was prepared as follows. A precursor solution prepared as described in Example I was spin coated and decomposed on the unused portion of the $CeO_2/YSZ/Y_2O_3/Ni$ buffered substrate prepared in Example IV using the protocol described in Example II to form an intermediate layer. The intermediate layer was removed by exposure to an about one percent aqueous nitric acid solution at room temperature for about four minutes. The surface of the $CeO_2$ layer on which the intermediate layer had been formed was thus chemically conditioned. A precursor solution prepared as described in Example I was then spin coated on the conditioned $CeO_2$ layer, decomposed and further heated using the protocol described in Example II. The $YBa_2Cu_3O_{7-N}$ layer had a critical current density of about $1.93 \times 10^6$ Amperes per square centimeter as determined by transport measurement at 77K in self field using a one microvolt per centimeter criterion.

EXAMPLE VI

A multi-layer article was prepared as follows. A $CeO_2$/YSZ/$CeO_2$/Ni buffered substrate was prepared using a precursor as described in Example I and the protocol described in Example II. The $CeO_2$ YSZ $CeO_2$Ni buffered substrate was cut into two portions. A precursor solution prepared as described in Example I was spin coated onto the surface of one portion of the $CeO_2$ YSZ $CeO_2$Ni buffered substrate. The coated sample was decomposed and further heated as described in Example II. The $YBa_2Cu_3O_{7-N}$ layer had a critical current density of about $0.55 \times 10^6$ Amperes per square centimeter as determined by transport measurement at 77K in self field using a one microvolt per centimeter criterion.

EXAMPLE VII

A multi-layer article was prepared as follows. The unused portion of the $CeO_2$/YSZ/$CeO_2$/Ni buffered substrate prepared in Example VI was exposed to an about one percent aqueous nitric acid solution at room temperature for about seven minutes to chemically condition the surface of the outer layer of $CeO_2$. A precursor solution prepared as described in Example I was then spin coated onto the conditioned $CeO_2$ surface, decomposed and further heated as described in Example II. The $YBa_2Cu_3O_{7-N}$ layer had a critical current density of about 1 $10 \times 10^6$ Amperes per square centimeter as determined by transport measurement at 77K in self field using a one microvolt per centimeter criterion.

EXAMPLE VIII

Figure 3:
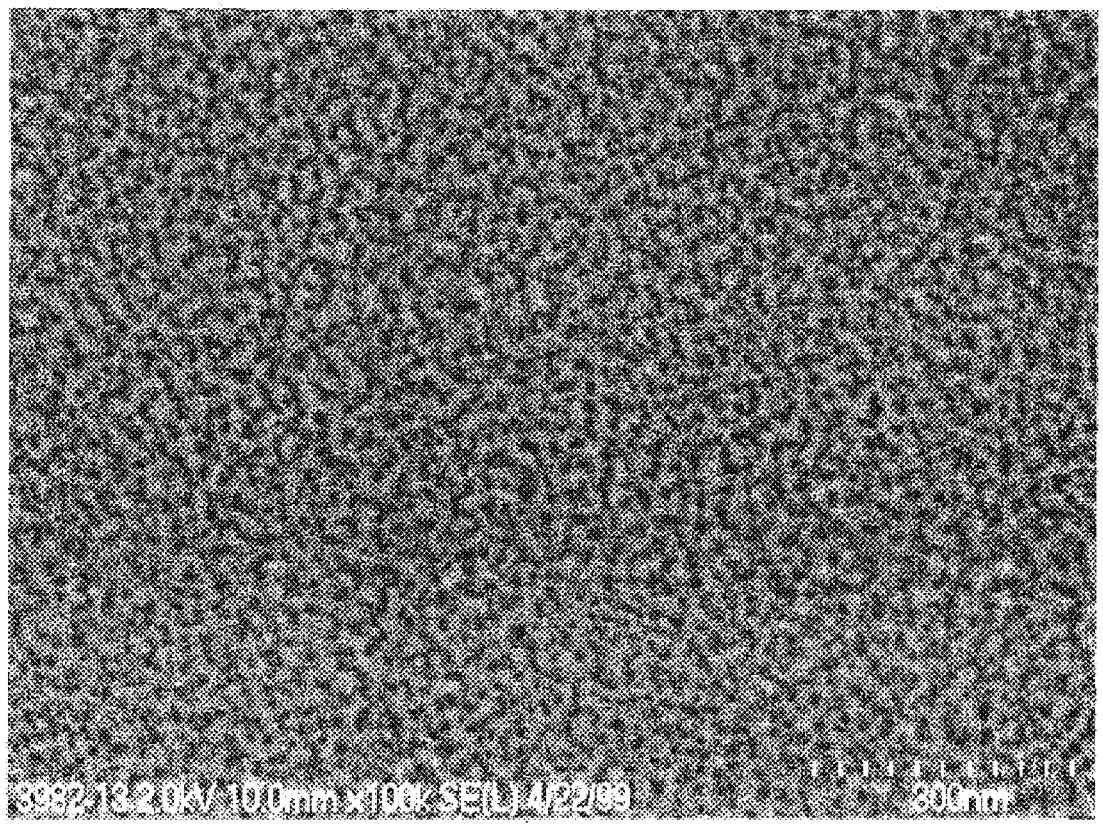
FIG. 3 is a high resolution scanning electron micrograph of a $CeO_2$ surface prepared as described in Example VIII.

A buffered substrate was prepared as follows. An about 20 nanometer thick layer of $CeO_2$ was sputter deposited on a YSZ[100] single crystal surface at a rate of about 0.35 Angstroms per second at a temperature of about 725° C. A high resolution scanning electron micrograph (100,000 times magnification) of the resulting surface is shown in FIG. 3.

EXAMPLE IX

A multi-layer article was prepared as follows. A $CeO_2$/YSZ[100] buffered substrate was prepared at the same time and in the same vacuum chamber as described in Example VIII. A layer of $YBa_2Cu_3O_{7-N}$ was formed on the $CeO_2$ surface using a precursor solution as described in Example I and the process parameters described in Example II. The $YBa_2Cu_3O_{7-N}$ layer had a critical current density of about $1.5 \times 10^6$ Amperes per square centimeter as determined by transport measurement at 77K in self field using a one microvolt per centimeter criterion.

EXAMPLE X

Figure 4:
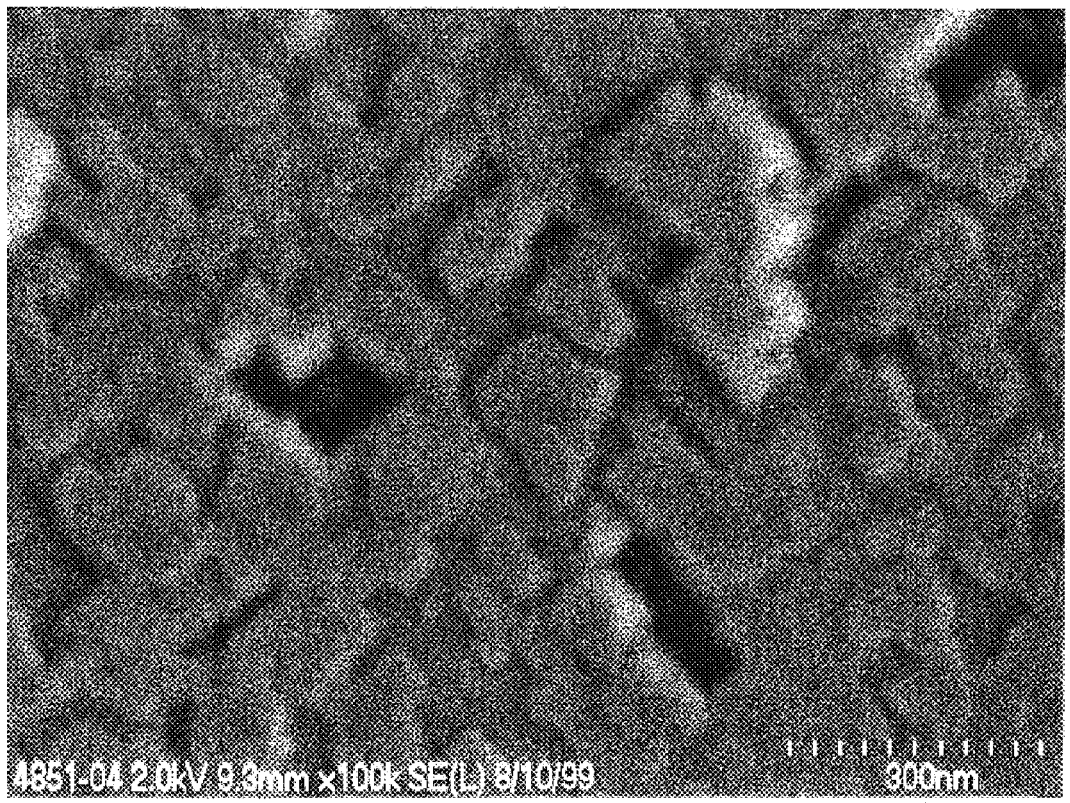
FIG. 4 is a high resolution scanning electron micrograph of a $CeO_2$ surface prepared as described in Example X.

A $CeO_2$/YSZ[100] buffered substrate was prepared using the process parameters described in Example VIII and heated to about 950° C. for about 60 minutes in a gas environment having a nominal total gas pressure of about 760 Torr of a forming gas (about four volume percent hydrogen, from about $1 \times 10^{-12}$ Torr to about $1 \times 10^{-16}$ Torr oxygen, and balance argon). A high resolution scanning element micrograph (100,000 times magnification) of the resulting surface is shown in FIG. 4.

EXAMPLE XI

A multi-layer article was prepared as follows. A $CeO_2$/YSZ[100] buffered substrate was prepared at the same time and in the same vacuum chamber as described in Example X. The $CeO_2$/YSZ[100] buffered substrate was conditioned at the same time and in the same furnace as described in Example X. A layer of $YBa_2Cu_3O_{7-N}$ was formed on the conditioned $CeO_2$ surface using the process parameters described in Example II. The $YBa_2Cu_3O_{7-N}$ layer had a critical current density of about $2.75 \times 10^6$ Amperes per square centimeter as determined by transport measurement at 77K in self field using a one microvolt per centimeter criterion.

EXAMPLE XII

Figure 5:
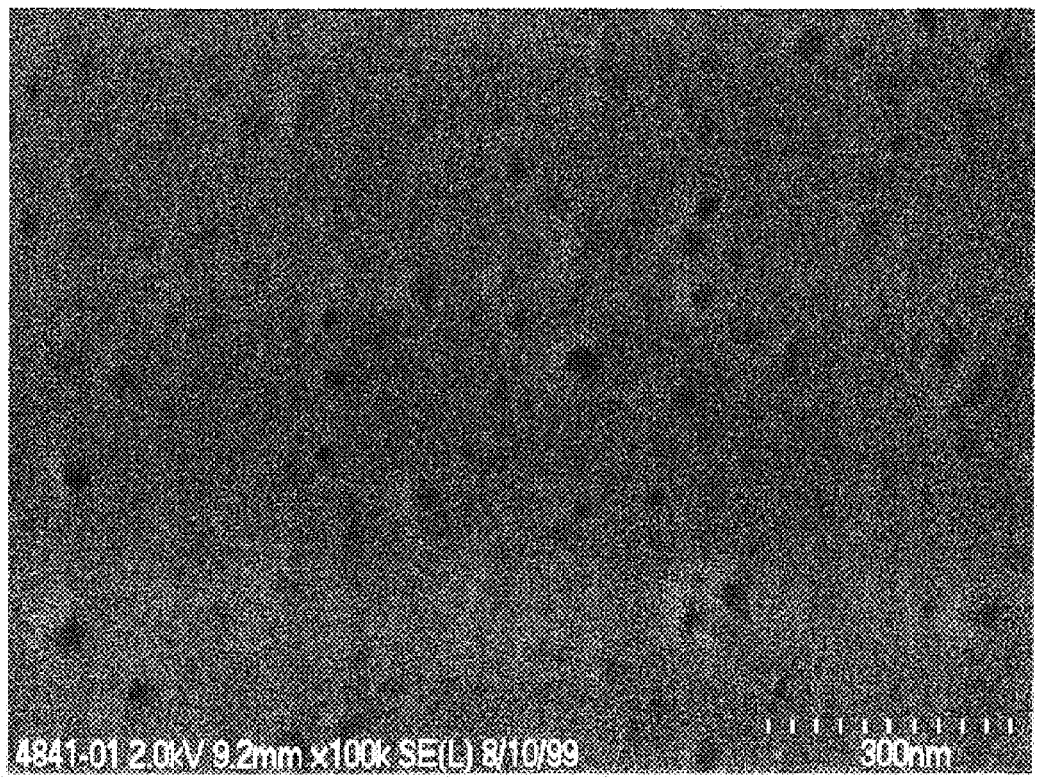
FIG. 5 is a high resolution scanning electron micrograph of a $CeO_2$ surface prepared as described in Example XII.

A $CeO_2$/YSZ[100] buffered substrate was prepared using the process parameters described in Example VIII and heated to about 950° C. for about 60 minutes in a gas environment having a nominal total pressure of about 760 Torr (about 760 Torr oxygen). A high resolution scanning electron micrograph (100,000 times magnification) of the resulting surface is shown in FIG. 5.

EXAMPLE XIII

A multi-layer article was prepared as follows. A $CeO_2$ YSZ[100] buffered substrate was prepared at the same time and in the same vacuum chamber as described in Example XII. The $CeO_2$ YSZ[100] buffered substrate was conditioned at the same time and in the same furnace as described in Example XII. A layer of $YBa_2Cu_3O_{7-N}$ was formed on the $CeO_2$ surface using the process parameters described in Example II except that the sample was held at about 725° C. for about four hours rather than about three hours. The $YBa_2Cu_3O_{7-N}$ layer had a critical current density of about $3.5 \times 10^6$ Amperes per square centimeter as determined by transport measurement at 77K in self field using a one microvolt per centimeter criterion.

EXAMPLE XIV

A multi-layer article was prepared using the process parameters described in Example XI except that: 1.) the intermediate layer was held at about 765° C. for about one hour in the water vapor/oxygen/nitrogen environment rather than about 725° C. for about three hours in the water vapor/oxygen/nitrogen environment; and 2.) intermediate layer was held at about 765° C. for about ten minutes in the oxygen/nitrogen environment rather than about 725° C. for about ten minutes in the oxygen/nitrogen environment. The $YBa_2Cu_3O_{7-N}$ layer had a critical current density of about $4.2 \times 10^6$ Amperes per square centimeter as determined by transport measurement at 77K in self field using a one microvolt per centimeter criterion.

EXAMPLE XV

A precursor solution was prepared as follows. About 1.36 grams of $Y(CF_2CO_2)_3 \cdot 4H_2O$, about 2.46 grams of $Ba(CF_3CO_2)_2$ and about 2.51 grams of $Cu(CF_3CO_2)_2 \cdot H_2O$ were dissolved in about five millimeters of methanol. About 0.86 milliliters of water was then added and the total volume of the solution was adjusted to about 10 milliliters with methanol.

EXAMPLE XVI

A multi-layer article was prepared as follows. A precursor solution prepared as described in Example XV was spin coated onto a $CeO_2$/YSZ(100) single crystal buffered substrate using the protocol described in Example II. The buffered substrate was prepared by sputter depositing an about 20 nanometer layer of $CeO_2$ onto the YSZ(100) at a rate of about 0.35 Angstroms per second at a temperature of about 725° C. Prior to deposition of the precursor solution, the sample was heated to about 950° C. for about one hour in an environment having a nominal total gas pressure of about 760 Torr of a forming gas (about four volume percent hydrogen in argon). The gas environment had a nominal oxygen gas pressure of from about $1 \times 10^{-12}$ Torr to about $1 \times 10^{-16}$ Torr.

The coated sample was decomposed as follows. The sample was heated from room temperature to about 210° C. at a rate of about 10° C. per minute in a nominal gas environment having a total gas pressure of about 760 Torr (water vapor pressure of about 24 Torr and balance oxygen). An about 2.25" diameter furnace was used, and the gas flow rate was about 4.5 standard cubic feet per hour. While keeping substantially the same nominal gas environment, the temperature was increased to about 230° C. at a rate of about 0.05° C. per minute, followed by heating to about 400° C. at a rate of about 5° C. per minute to form an intermediate layer. The intermediate layer was then heated to about 765° C. at a rate of about 10° C. per minute in a gas environment having a nominal total pressure of about 760 Torr (about 76 milliTorr oxygen, about 17 Torr water vapor and balance nitrogen). The layer was held under these, conditions for about seventy minutes. The layer was then held at about 765° C. for about 10 minutes in a gas environment having a nominal total gas pressure of about 760 Torr (about 0.076 Torr oxygen and balance nitrogen). Using substantially the same nominal gas environment, the layer was cooled to about 450° C. The layer was held at about 450° C. for about one hour in an environment having a nominal total gas pressure of about 760 Torr (about 760 Torr oxygen), and then cooled to room temperature. The $YBa_2Cu_3O_{7-N}$ layer had a critical current density of about $4.3 \times 10^6$ Amperes per square centimeter as determined by transport measurement at 77K in self field using a one microvolt per centimeter criterion.

EXAMPLE XVII

A $CeO_2$/YSZ/$CeO_2$/Ni buffered substrate was prepared as follows. The Ni layer was prepared as described in Example II. The $CeO_2$/YSZ/$CeO_2$ layers were deposited at Oak Ridge National Laboratory. The buffered substrate was cut into two portions. Using the process parameters described in Example II, one portion of the buffered substrate was spin coated with a precursor solution prepared as described in Example I, and then decomposed to form an intermediate layer.

The intermediate layer was heated to about 725° C. at a rate of about 10° C. per minute and held for about three hours in an environment having a nominal total gas pressure of about 760 Torr (water vapor pressure of about 17 Torr, oxygen gas pressure of about 76 milliTorr and balance nitrogen), followed by holding the temperature at about 725° C. for about 10 minutes in an environment having a nominal total gas pressure of about 760 Torr (oxygen gas pressure of about 76 milliTorr, about 5 milliTorr water, and balance nitrogen). The layer was then cooled to about 450° C. in the same nominal gas environment. The layer was held at about 450° C. for about one hour in a gas environment having a nominal total pressure of about 760 Torr (about 760 Torr oxygen), and subsequently cooled to room temperature to form a $YBa_2Cu_3O_{7-N}$ layer.

The $YBa_2Cu_3O_{7-N}$ layer had a critical current density of about $0.6 \times 10^6$ Amperes per square centimeter as determined by transport measurement at 77K in self field using a one microVolt per centimeter criterion.

EXAMPLE XVIII

A multi-layer article was prepared as follows. The unused portion of the $CeO_2$/YSZ/$CeO_2$/Ni buffered substrate prepared in Example XVII was held at about 950° C. for about one hour in a gas environment having a nominal total gas pressure of about 760 Torr (17 Torr water and forming gas (about five volume percent hydrogen in argon)). The gas environment had a nominal oxygen gas pressure of from about $1 \times 10^{-12}$ Torr to about $1 \times 10^{-16}$ Torr. This conditioned the surface of the $CeO_2$/YSZ/$CeO_2$/Ni buffered substrate.

Using the process parameters of Example II, a precursor solution prepared as described in Example I was spin coated onto the conditioned surface of the $CeO_2$/YSZ/$CeO_2$/Ni buffered substrate, and then decomposed to form a substantially defect-free intermediate layer.

The intermediate layer was heat treated as described in Example XVII to form a $YBa_2Cu_3O_{7-N}$ layer had a critical current density of about $1.5 \times 10^6$ Amperes per square centimeter as determined by transport measurement at 77K in self field using a one microvolt per centimeter criterion.

EXAMPLE XIX

A $CeO_2$/YSZ/$Y_2O_3$/Ni buffered substrate was prepared as follows. The Ni substrate was described as described in Example II. The $Y_2O_3$ layer was about 100 nanometers thick and was deposited at a rate of about 0.1 Angstroms per second at a temperature of about 650° C. using electron beam evaporation. The YSZ layer was about 700 nanometers thick and was deposited at a rate of about 0.1 Angstroms per second at a temperature of about 700° C. using magnetron sputtering. The $CeO_2$ layer was about 19.2 nanometers thick and was deposited at a rate of about 0.6 Angstroms per second at a temperature of about 700° C. using magnetron sputtering.

The buffered substrate was cut into two portions. Using the process parameters described in Example II, one portion of the buffered substrate was spin coated with a precursor solution prepared as described in Example I, and then decomposed to form an intermediate layer.

The intermediate layer was heat treated as described in Example XVII to form a $YBa_2Cu_3O_{7-x}$ layer. The $YBa_2Cu_3O_{7-x}$ layer had a critical current density of about $0.01 \times 10^6$ Amperes per square centimeter as determined by transport measurement at 77K in self field using a one micro Volt per centimeter criterion.

EXAMPLE XX

A multi-layer article was prepared as follows. The unused portion of the $CeO_2$/YSZ/$Y_2O_3$/Ni buffered substrate prepared in Example XIX was conditioned as described in Example XVIII. Using the process parameters of Example II, a precursor solution prepared as described in Example I was spin coated onto the conditioned surface of the $CeO_2$/YSZ/$Y_2O_3$/Ni buffered substrate, and then decomposed to form a substantially defect-free intermediate layer.

The intermediate layer was heat treated as described in Example XVII to form a $YBa_2Cu_3O_{7-x}$ layer. The $YBa_2Cu_3O_{7-x}$ layer had a critical current density of about $1.0 \times 10^6$ Amperes per square centimeter as determined by transport measurement at 77K in self field using a one microvolt per centimeter criterion.

EXAMPLE XXI

A multi-layer article was prepared as follows. A buffered substrate was prepared using the process parameters described in Example XIX except that: 1.) the $Y_2O_3$ layer was replaced with an about 100 nanometer thick layer of $Gd_2O_3$ deposited from a gadolinium alkoxide solution in a forming gas environment. The $CeO_2$/YSZ/$Gd_2O_3$/Ni buffered substrate was cut into two portions. Using the process parameters described in Example II, one portion of the buffered substrate was spin coated with a precursor solution prepared as described in Example I, and then decomposed to form an intermediate layer.

The intermediate layer was heat treated as described in Example XVII to form a $YBa_2Cu_3O_{7-x}$ layer. The $YBa_2Cu_3O_{7-x}$ layer had a critical current density of about $0.04 \times 10^6$ Amperes per square centimeter as determined by transport measurement at 77K in self field using a one micro Volt per centimeter criterion.

EXAMPLE XXII

A multi-layer article was prepared as follows. The unused portion of the $CeO_2$/YSZ/$Gd_2O_3$/Ni buffered substrate prepared in Example XXI was conditioned as described in Example XVIII. Using the process parameters of Example II, a precursor solution prepared as described in Example I was spin coated onto the conditioned surface of the $CeO_2$/YSZ/$Gd_2O_3$/Ni buffered substrate, and then decomposed to form a substantially defect-free decomposed layer.

The decomposed layer was heat treated as described in Example XVII to form a $YBa_2Cu_3O_{7-x}$ layer. The $YBa_2Cu_3O_{7-x}$ layer had a critical current density of about $1.5 \times 10^6$ Amperes per square centimeter as determined by transport measurement at 77K in self field using a one microvolt per centimeter criterion.

While the invention has been described with respect to methods of making multi-layer articles that are superconductors, the invention is not limited to such methods. The methods of the invention can also be used to prepare other multi-layer articles, such as multi-layer articles that are semiconductors or multi-layer articles that are electroceramics which include one or more ferroelectric layers.

Other embodiments are in the claims.

What is claimed is:

1. A method of making a multi-layer article, comprising:
   epitaxially depositing a first material on a surface of a third material to form a deposited layer of the first material, the first material being a buffer material, the deposited layer of the first material having a surface with a crystallinity and a morphology;
   chemically conditioning the surface of the deposited layer of the first material to form a conditioned surface having a crystallinity and a morphology, the crystallinity of the conditioned surface being substantially the same as the crystallinity of the surface of the deposited layer, and the morphology of the conditioned surface being different from the morphology of the deposited layer; and
   disposing a layer of a second material on the conditioned surface.

2. The method of claim 1, wherein the conditioned surface is biaxially textured.

3. The method of claim 1, wherein the second material comprises a material selected from the group consisting of a superconductor material and a precursor of a superconductor material.

4. The method of claim 1, wherein the second material comprises a buffer material.

5. The method of claim 1, wherein the second material comprises a cap material.

6. The method of claim 1, wherein the layer of the second material is disposed on the conditioned surface prior to annealing the conditioned surface.

7. The method of claim 1, further comprising disposing a layer of a fourth material on a surface of the layer of the second material.

8. The method of claim 7, further comprising, prior to disposing the layer of the fourth material on the surface of the layer of the second material, conditioning the surface of the layer of the second material.

9. The method of claim 8, wherein conditioning the surface of the layer of the second material includes chemically conditioning the surface of the layer of the second material.

10. The method of claim 8, wherein conditioning the surface of the layer of the second material includes thermally conditioning the surface of the layer of the second material.

11. The method of claim 8, wherein, subsequent to conditioning the surface of the layer of the second material, the surface of the second material is biaxially textured.

12. The method of claim 1, further comprising thermally conditioning the conditioned surface.

13. The method of claim 1, wherein the third material comprises a substrate material.

14. The method of claim 1, wherein the surface of the layer of the third material is biaxially textured.

15. The method of claim 1, wherein the third material comprises a single crystal material.

16. The method of claim 1, wherein the second material has a critical current density of at least about $1 \times 10^6$ Amperes per square centimeter.

17. A method of making a multi-layer article, comprising:
   epitaxially depositing a first material on a surface of a third material to form a deposited layer of the first material, the first material being a buffer material, the deposited layer of the first material having a surface with a crystallinity and a morphology;
   heating, at an oxygen gas pressure of less than about 700 Torr, the surface of the deposited layer of the first material to a temperature at least about 5° C. above a temperature selected from the group consisting of a deposition temperature of the layer of the first material and a crystallization temperature of the layer of the first material to form a conditioned surface having a crystallinity and a morphology, the crystallinity of the conditioned surface being substantially the same as the crystallinity of the surface of the deposited layer, and the morphology of the conditioned surface being different from the morphology of the deposited layer; and
   disposing a second material on the conditioned surface.

18. The method of claim 17, wherein the conditioned surface is a biaxially textured surface.

19. The method of claim 17, wherein the second material comprises a material selected from the group consisting of a superconductor and a precursor of a superconductor.

20. The method of claim 17, wherein the second material comprises a buffer material.

21. The method of claim 17, wherein the second material comprises a cap material.

22. The method of claim 17, wherein the second material layer has a biaxially textured surface.

23. The method of claim 17, wherein the temperature is from about 10° C. to about 500° C. above the temperature selected from the group consisting of a deposition temperature of the first layer and a crystallization temperature of the first layer.

24. The method of claim 17, wherein the temperature is from about 75° C. to about 300° C. above the temperature selected from the group consisting of a deposition temperature of the first layer and a crystallization temperature of the first layer.

25. The method of claim 17, wherein the oxygen gas pressure is less than about 100 Torr.

26. The method of claim 17, wherein the oxygen gas pressure is less than about 1 Torr.

27. The method of claim 17, wherein the surface of the layer of the first material is heated in an environment comprised primarily of hydrogen and inert gas.

28. The method of claim 17, wherein the surface of the layer of the first material is heated in an environment comprised primarily of inert gas.

29. The method of claim 17, wherein the third material comprises a substrate material.

30. The method of claim 17, wherein the third material comprises a material selected from the group consisting of nickel and silver.

31. The method of claim 17, wherein the surface of the layer of the third material is biaxially textured.

32. The method of claim 17, wherein the third material comprises a single crystal material.

33. The method of claim 17, further comprising chemically conditioning the conditioned surface.

34. The method of claim 17, wherein the second material has a critical current density of at least about $1 \times 10^6$ Amperes per square centimeter.

35. A method of making a multi-layer article, comprising:
   epitaxially depositing a first material on a surface of a third material to form a deposited layer of the first material, the first material being a buffer material, the deposited layer of the first material having a surface with a crystallinity and a morphology;
   heating the surface of the deposited layer of the first material to a temperature at least about 5° C. above a temperature selected from the group consisting of a deposition temperature of the layer of the first material and a crystallization temperature of the layer of the first material to form a conditioned surface having a crystallinity and a morphology, the crystallinity of the conditioned surface being substantially the same as the crystallinity of the surface of the deposited layer, and the morphology of the conditioned surface being different from the morphology of the deposited layer, the first material being disposed on a surface of a polycrystalline material; and
   disposing a second material layer on the conditioned surface.

36. The method of claim 35, wherein the conditioned surface is biaxially textured.

37. The method of claim 35, wherein the polycrystalline material comprises a substrate material.

38. The method of claim 35, wherein the polycrystalline material comprises a textured material.

39. The method of claim 38, wherein the textured material has a biaxially textured surface.

40. The method of claim 35, wherein the second material comprises a material selected from the group consisting of a superconductor and a precursor of a superconductor.

41. The method of claim 35, wherein the second material comprises a buffer material.

42. The method of claim 35, wherein the second material layer has a biaxially textured surface.

43. The method of claim 35, wherein the temperature is from about 10° C. to about 500° C. above the temperature selected from the group consisting of a deposition temperature of the first layer and a crystallization temperature of the first layer.

44. The method of claim 35, wherein the temperature is from about 75° C. to about 300° C. above the temperature selected from the group consisting of a deposition temperature of the first layer and a crystallization temperature of the first layer.

45. The method of claim 35, further comprising chemically conditioning the conditioned surface.

46. The method of claim 35, wherein the second material has a critical current density of at least about $1 \times 10^6$ Amperes per square centimeter.

47. The method of claim 17, wherein the surface of the layer of the first material is heated in an environment comprising water vapor.

48. The method of claim 47, wherein the environment further comprises hydrogen and an inert gas.

49. The method of claim 35, wherein the surface of the layer of the first material is heated in an environment comprising water vapor.

50. The method of claim 49, wherein of the environment further comprises hydrogen and an inert gas.

* * * * *